(12) United States Patent
Konevecki et al.

(10) Patent No.: US 7,915,164 B2
(45) Date of Patent: Mar. 29, 2011

(54) METHOD FOR FORMING DOPED POLYSILICON VIA CONNECTING POLYSILICON LAYERS

(75) Inventors: Michael W. Konevecki, San Jose, CA (US); Usha Raghuram, San Jose, CA (US); Maitreyee Mahajani, Saratoga, CA (US); Sucheta Nallamothu, San Jose, CA (US); Andrew J. Walker, Mountain View, CA (US); Tanmay Kumar, Pleasanton, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 12/897,696

(22) Filed: Oct. 4, 2010

(65) Prior Publication Data

US 2011/0021019 A1    Jan. 27, 2011

Related U.S. Application Data

(62) Division of application No. 12/489,214, filed on Jun. 22, 2009, which is a division of application No. 10/955,710, filed on Sep. 29, 2004, now Pat. No. 7,566,974.

(51) Int. Cl.
*H01L 21/8246* (2006.01)
*H01L 21/768* (2006.01)

(52) U.S. Cl. ............... 438/672; 438/675; 257/E21.585; 257/E21.627; 257/E21.677

(58) Field of Classification Search .............. 438/368, 438/672, 675, 684; 257/E21.627, E21.585, 257/E21.641, E21.677
See application file for complete search history.

(56) References Cited

U.S. PATENT DOCUMENTS

| | | |
|---|---|---|
| 4,272,880 A | 6/1981 | Pushley |
| 4,500,905 A | 2/1985 | Shibata |
| 4,939,568 A | 7/1990 | Kato |
| 5,041,884 A | 8/1991 | Kumamoto et al. |
| 5,128,732 A | 7/1992 | Sugahara et al. |
| 5,291,058 A | 3/1994 | Samata |
| 5,534,460 A | 7/1996 | Tseng et al. |
| 5,587,338 A | 12/1996 | Tseng |
| 5,599,736 A | 2/1997 | Tseng |
| 5,624,863 A | 4/1997 | Helm |
| 5,670,812 A | 9/1997 | Adler et al. |
| 5,804,470 A | 9/1998 | Wollesen |
| 5,834,341 A | 11/1998 | Chen |
| 5,915,167 A | 6/1999 | Leedy |

(Continued)

OTHER PUBLICATIONS

Solar Energy Systems, Monocrystalline Silicon, http://www.cogeneration.net/monocrystalline_silicon.htm, 1999.

(Continued)

*Primary Examiner* — David Vu
*Assistant Examiner* — Earl N Taylor
(74) *Attorney, Agent, or Firm* — Vierra Magen Marcus & DeNiro LLP

(57) ABSTRACT

The invention provides for polysilicon vias connecting conductive polysilicon layers formed at different heights. Polysilicon vias are advantageously used in a monolithic three dimensional memory array of charge storage transistors. Polysilicon vias according to the present invention can be used, for example, to connect the channel layer of a first device level of charge storage transistor memory cells to the channel layer of a second device layer of such cells formed above the first device level. Similarly, vias according to the present invention can be used to connect the wordline of a first device level of charge storage transistor memory cells to the channel layer of a second device layer of such cells.

7 Claims, 8 Drawing Sheets

U.S. PATENT DOCUMENTS

| | | | |
|---|---|---|---|
| 6,005,270 | A | 12/1999 | Noguchi |
| 6,034,882 | A | 3/2000 | Johnson |
| 6,080,664 | A | 6/2000 | Huang |
| 6,127,217 | A | 10/2000 | Madurawe |
| 6,172,381 | B1 | 1/2001 | Gardner et al. |
| 6,239,458 | B1 | 5/2001 | Liaw |
| 6,259,118 | B1 | 7/2001 | Kadosh et al. |
| 6,358,828 | B1 | 3/2002 | Kadosh et al. |
| 6,420,215 | B1 | 7/2002 | Knall |
| 6,429,484 | B1 | 8/2002 | Yu |
| 6,525,953 | B1 | 2/2003 | Johnson |
| 6,600,173 | B2 | 7/2003 | Tiwari |
| 6,611,023 | B1 | 8/2003 | En |
| 6,635,552 | B1 | 10/2003 | Gonzalez |
| 6,638,834 | B2 | 10/2003 | Gonzalez |
| 6,664,639 | B2 | 12/2003 | Cleeves |
| 6,713,371 | B1 | 3/2004 | Gu |
| 6,853,049 | B2 | 2/2005 | Herner |
| 6,858,899 | B2 | 2/2005 | Walker |
| 6,872,618 | B2 | 3/2005 | Lee |
| 6,881,994 | B2 | 4/2005 | Lee |
| 6,887,753 | B2 | 5/2005 | Gonzalez |
| 6,927,431 | B2 | 8/2005 | Gonzalez |
| 6,940,109 | B2 | 9/2005 | Pate |
| 6,952,043 | B2 | 10/2005 | Vyvoda |
| 7,005,350 | B2 | 2/2006 | Walker |
| 7,195,992 | B2 | 3/2007 | Gu |
| 7,307,013 | B2 | 12/2007 | Raghuran |
| 7,474,000 | B2 | 1/2009 | Scheuerlein et al. |
| 7,505,321 | B2 | 3/2009 | Scheuerlein |
| 7,511,352 | B2 | 3/2009 | Vyvoda |
| 7,566,974 | B2 | 7/2009 | Konevecki et al. |
| 2001/0008785 | A1 | 7/2001 | Liao |
| 2002/0025604 | A1 | 2/2002 | Tiwari |
| 2002/0036351 | A1 | 3/2002 | Suh et al. |
| 2002/0196655 | A1 | 12/2002 | Salling |
| 2003/0030074 | A1 | 2/2003 | Walker |
| 2003/0059999 | A1 | 3/2003 | Gonzalez |
| 2003/0173654 | A1 | 9/2003 | Rodgers et al. |
| 2004/0124415 | A1 | 7/2004 | Walker et al. |
| 2004/0124466 | A1 | 7/2004 | Walker |
| 2004/0125629 | A1 | 7/2004 | Scheuerlein |
| 2004/0232509 | A1 | 11/2004 | Vyvoda |
| 2004/0266206 | A1 | 12/2004 | Cleeves |
| 2005/0127519 | A1 | 6/2005 | Scheuerlein et al. |
| 2006/0003586 | A1 | 1/2006 | Raghuram |
| 2006/0051911 | A1 | 3/2006 | Gu |
| 2006/0071074 | A1 | 4/2006 | Konevecki |
| 2009/0258462 | A1 | 10/2009 | Konevecki et al. |

OTHER PUBLICATIONS

Wolf, Stanley, Silicon Processing for the VLSI Era: vol. 2—Process Integration, "Multilevel-interconnect technology for VSSI and ULSI," 1990, p. 253.

Restriction dated May 27, 2010, in U.S. Appl. No. 12/489,214, filed Jun. 22, 2009.

Amendment dated Jun. 17, 2010, in U.S. Appl. No. 12/489,214, filed Jun. 22, 2009.

Office Action dated Sep. 2, 2010, in U.S. Appl. No. 12/489,214, filed Jun. 22, 2009.

Notice of Allowance and Fee(s) Due dated Dec. 10, 2010, U.S. Appl. No. 12/489,214 filed Jun. 22, 2009.

METHOD FOR FORMING DOPED POLYSILICON VIA CONNECTING POLYSILICON LAYERS

CROSS-REFERENCE TO RELATED APPLICATIONS

This application is a divisional of U.S. patent application Ser. No. 12/489,214 filed Jun. 22, 2009, published as US2009/0258462 on Oct. 15, 2009, incorporated herein by reference, which in turn is a divisional of U.S. patent application Ser. No. 10/955,710, filed Sep. 29, 2004, issued as U.S. Pat. No. 7,566,974 on Jul. 28, 2009, incorporated herein by reference.

BACKGROUND OF THE INVENTION

The invention relates to use of doped polycrystalline silicon (polysilicon) vias to provide electrical connection between vertically separate polysilicon layers, specifically polysilicon channel layers in transistors, gate electrodes, and other device elements.

When an electrical connection needs to be made between vertically separate layers in a semiconductor device, a vertical interconnect or via is typically formed of a conductive material to connect them.

The typical method of formation is to form the lower layer to which connection is needed, then cover it with an insulating layer. Next a hole or void is excavated in the insulating layer, and the void is filled with a conductive material, forming the via. The upper layer to which conduction is needed is then formed above and in contact with the via. Alternately, the via and the upper conductive layer can be formed of the same material, in a single deposition step.

Among the most common materials used for vias is tungsten. Tungsten vias or plugs are not compatible with all devices and materials, however.

There is a need, therefore, for other methods and materials to be used for forming vias in semiconductor structures.

SUMMARY OF THE PREFERRED EMBODIMENTS

The present invention is defined by the following claims, and nothing in this section should be taken as a limitation on those claims. In general, the invention is directed to polysilicon vias used to provide electrical connection to polysilicon structures.

A first aspect of the invention provides for a structure in a semiconductor device comprising a lower polysilicon layer; a polysilicon via above the lower polysilicon layer, the polysilicon via having a top end and a bottom end, wherein the bottom end of the polysilicon via is in contact with the lower polysilicon layer; and an upper polysilicon layer above the polysilicon via, wherein the top end of the polysilicon via is in contact with the upper polysilicon layer.

Another aspect of the invention provides for a structure in a semiconductor device comprising: an upper channel layer in a first device level of thin film transistors, the first device level at a first height above a substrate; and a polysilicon via in contact with the upper channel layer, wherein the upper channel layer is above the polysilicon via.

A preferred embodiment of the invention provides for a structure in a semiconductor device comprising: a first channel layer, wherein the first channel layer is a portion of a first device level of thin film transistors, the first device level at a first height above a substrate; a second channel layer, wherein the second channel layer is a portion of a second device level of thin film transistors, the second device level at a second height above the substrate, wherein the second height is above the first height; and a polysilicon via in contact with the first channel layer and in contact with the second channel layer.

Still another aspect of the invention provides for a structure in a semiconductor device comprising: a gate electrode at a first height above a substrate in an array of thin film transistors; a channel layer at a second height above the substrate in the array of thin film transistors, wherein the second height is above the first height; and a polysilicon via in contact with the gate electrode and in contact with the channel layer.

Another preferred embodiment of the invention provides for a monolithic three dimensional array of thin film transistors comprising: a substrate; a first polysilicon layer at a first height above the substrate; a second polysilicon layer at a second height above the substrate, wherein the second height is above the first height; and a polysilicon via, wherein the polysilicon via is disposed between and in contact with the first polysilicon layer and the second polysilicon layer, wherein the monolithic three dimensional array further comprises at least a first device level and a second device level, the second device level monolithically formed above the first device level.

A preferred embodiment of the invention provides for a method for forming a via structure in a semiconductor device, the method comprising: forming a polysilicon via through a dielectric material; planarizing a shared top surface of the polysilicon via and the dielectric material; and forming an upper polysilicon layer on and in contact with the polysilicon via.

Another aspect of the invention provides for a method for forming a via structure to connect device levels in a monolithic three dimensional array, the method comprising: providing a substrate; forming a first device level of thin film transistors at a first height above the substrate, the first device level comprising a first polysilicon layer; forming a polysilicon via above and in contact with the first polysilicon layer; and forming a second device level of thin film transistors at a second height above the substrate, wherein the second height is above the first height, the second device level comprising a second polysilicon layer, wherein the second polysilicon layer is above and in contact with the polysilicon via.

Each of the aspects and embodiments of the invention described herein can be used alone or in combination with one another.

The preferred aspects and embodiments will now be described with reference to the attached drawings.

BRIEF DESCRIPTION OF THE DRAWINGS

FIG. 3b is a cross-sectional view of the structure of FIG. 3a viewed at ninety degrees to the view of FIG. 3a.

FIG. 3c is a cross-sectional view of an alternative embodiment of the structure of FIG. 3a.

DETAILED DESCRIPTION OF THE INVENTION

Tungsten, the most common choice to form vias to provide electrical connection between vertically separate conductive layers, is not compatible with all materials and structures.

An example of conductive layers formed at different heights above a substrate in which vias formed according to the present invention might advantageously be used is found in Walker et al., U.S. patent application Ser. No. 10/335,089, "Programmable Memory Array Structure Incorporating Series-Connected Transistor Strings and Methods for Fabrication and Operation of Same", filed Dec. 31, 2002, (issued as U.S. Pat. No. 7,005,350 on Feb. 28, 2006) assigned to the assignee of the present invention and hereby incorporated by reference in its entirety. Walker et al. describes formation of a monolithic three dimensional memory array of charge storage devices.

Figure 1A:
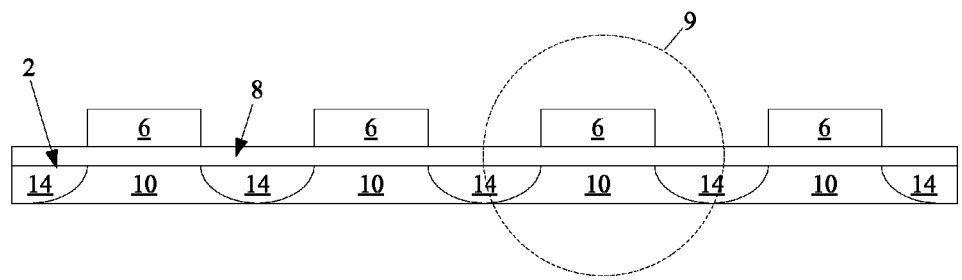
FIGS. 1a and 1b are cross-sectional views illustrate steps in formation of device levels connected by vias.

A first device level of an embodiment of Walker et al. is shown in FIG. 1a. A first channel layer 2 is formed of polysilicon. The term "channel layer" is used herein to mean a polysilicon layer in which one or more channel regions are formed and in which at least one source, drain, or shared source/drain may be formed. In this embodiment, the first channel layer 2 comprises the channel regions 10 and shared sources and drains 14 of a plurality of series-connected thin film transistors. Wordlines 6 (shown in cross-section) form the gate electrode for each transistor. A transistor 9 is formed wherever wordline 6 and channel layer 2 intersect. In this embodiment an ONO stack 8 separates channel region 10 from the gate electrode formed in wordline 6. Transistor 9 is a SONOS memory cell.

A typical SONOS memory cell consists of (from the bottom up) a silicon channel region, a tunneling oxide layer, a nitride charge storage layer, a blocking oxide layer, and a gate electrode, typically of silicon. The silicon-oxide-nitride-oxide-silicon stack gives the device its name. Other materials can replace some of the layers, however: Different dielectric materials can be used for the tunneling, charge storage, and blocking dielectric layers, and the gate electrode need not be silicon. The term "SONOS-type device" will be understood to mean a device that operates the same way a SONOS device operates, storing charge in a dielectric layer, but which is not necessarily limited to the materials conventionally used in a SONOS device. Mahajani et al., U.S. patent application Ser. No. 10/270,127, "Thin Film Transistor with Metal Oxide Layer and Method of Making Same," filed Oct. 15, 2002, (issued as U.S. Pat. No. 6,858,899 on Feb. 22, 2005) and hereby incorporated by references, describes formation and use of SONOS-type devices made using dielectric materials other than silicon oxide and silicon nitride.

Figure 1B:
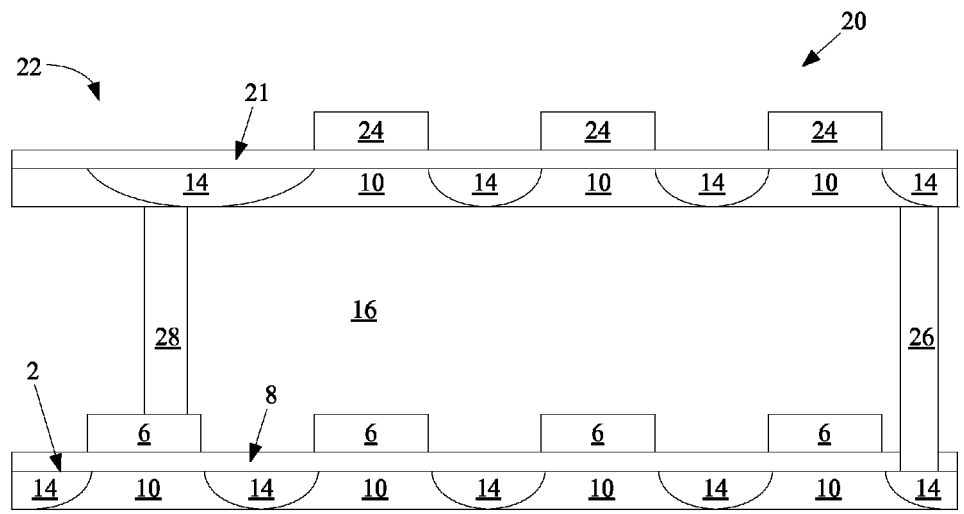

Turning to FIG. 1b, interlevel dielectric 16 is formed over first device level 18. A second device level 20 of SONOS devices is formed above interdielectric level 16, including second channel layers 22 and second wordlines 24. An ONO stack 21 separates second channel layers 22 and second wordlines 24.

An electrical connection may be required between first channel layer 2 and second channel layer 22. This can be done by forming via 26 of a conductive material. An electrical connection may also be required between a wordline 6 of first device level 18 and second channel layer 22, for example by forming via 28 of a conductive material.

It will be understood by those skilled in the art that the locations of vias 26 and 28 in FIG. 1b are illustrative only. These vias could be formed at any point at which an electrical connection is desirable.

Most often in semiconductor devices, vias provide connections between metal wiring layers, particularly to metal wiring formed above the via. For this purpose, vias are advantageously formed of tungsten or of some other conductive metal.

The embodiment shown in FIG. 1b is unusual in that vias 26 and 28 must provide connectivity to an overlying polysilicon layer, or between two polysilicon layers. It has been found that if, for example, vias 26 or 28 are conventional vias formed of tungsten, problems may occur during fabrication of an overlying polysilicon layer connecting to the via such as channel layer 22.

Figure 2A:
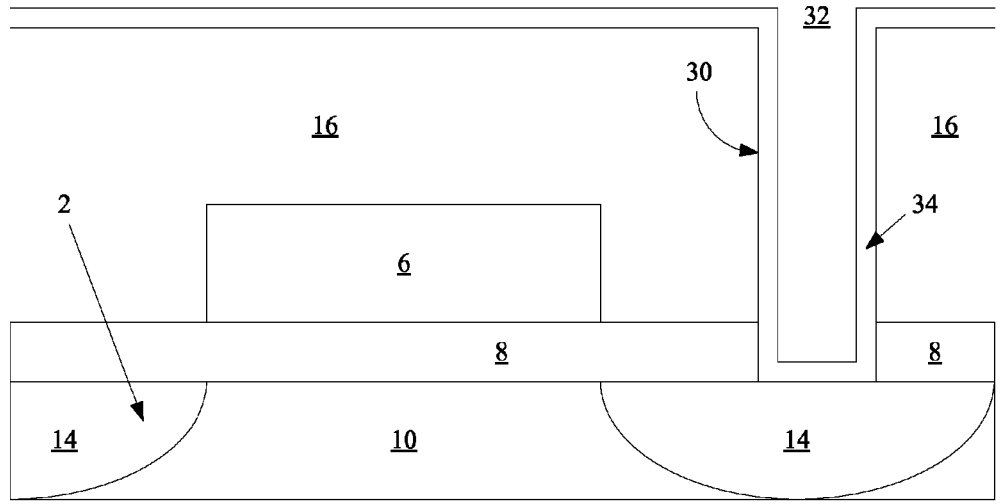
FIGS. 2a and 2b are cross-sectional views illustrating steps in formation of a tungsten via connecting two device levels.
Figure 2B:
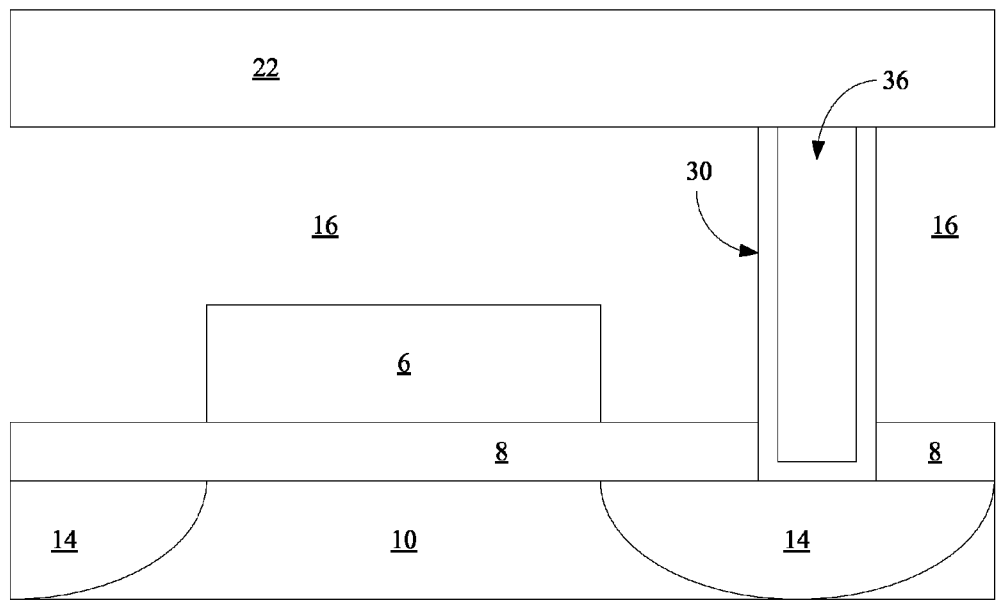

FIG. 2a shows a portion of the device of FIG. 1b after formation of first device level 18 and formation and planarization of interlevel dielectric 16 above it. A void 30 is etched in interlevel dielectric 16, etching through the ONO stack 8 and exposing first channel layer 2. If a conventional tungsten via were to be formed, void 30 could be filled with tungsten layer 32. A thin optional adhesion and barrier layer 34 of, for example, titanium nitride may be deposited first, forming a liner, to improve the adhesion of tungsten layer 32 to dielectric 16. The overfill of tungsten layer 32 and barrier layer 34 are removed and the surface planarized, for example by chemical mechanical polishing (CMP), to form finished tungsten via 36, shown in FIG. 2b.

The difficulty may arise upon formation of the next layer, second channel layer 22. This layer would most typically be formed by depositing silicon. Silicon is typically deposited on a surface by flowing a precursor gas containing silicon over the surface. The precursor gas most commonly used to deposit silicon is silane ($SiH_4$).

Silane reacts violently with tungsten, however, and the reaction may cause an undesirable reaction, creating "volcanoes" that will prevent formation of a structurally and electrically intact channel layer. An appropriate barrier of some sort between the tungsten and the silane is required, but such a barrier is difficult to form without complicating the process.

Figure 2C:
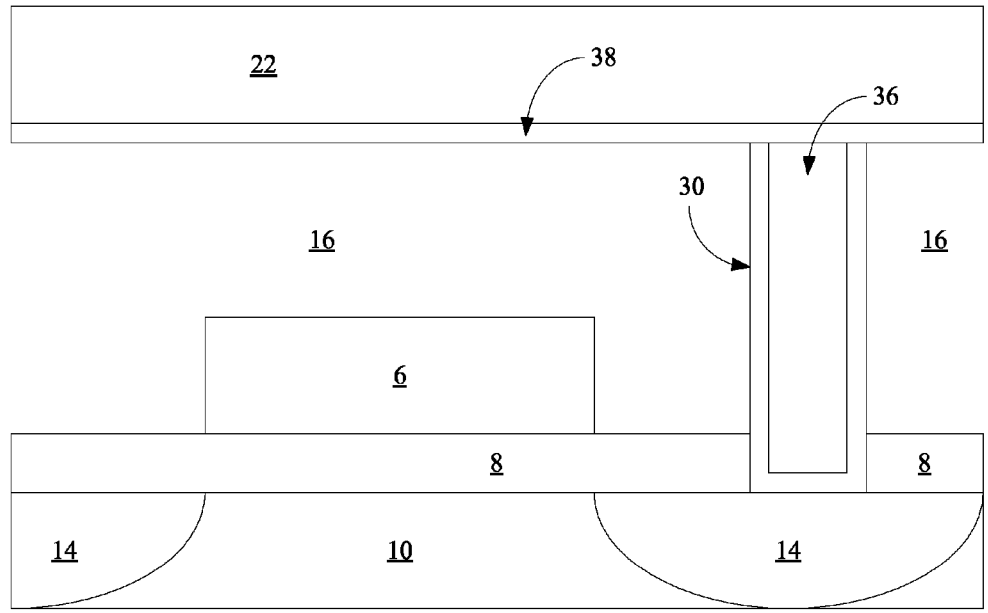
FIG. 2c is a cross-sectional view illustrating how a conductive barrier layer renders the upper device level inoperative.

As shown in FIG. 2c, a conductive barrier layer 38 of, for example, titanium nitride, could be formed first, separating tungsten via 36 and channel layer 22 and allowing channel layer 22 to be formed. This barrier layer 38, however, would act as a conductor, and would prevent any portion of channel layer 22 from successfully operating as a channel region of a transistor. (It will be recalled that a channel region must be semiconducting: It must be conductive when voltage is applied to the gate electrode and the transistor is on, but must not be conductive when voltage is not applied to the gate electrode and the transistor is off. The presence of conductive layer 38 would effectively cause any transistors formed in channel layer 22 to be permanently on, regardless of the voltage applied to the gate conductor of any transistor.)

The present invention solves this connectivity problem with a minimum of process steps by forming a via of heavily doped polysilicon connecting to a top layer of polysilicon, or between polysilicon layers (such as vias 26 and 28 of FIG. 1b).

Fabrication of two device levels of charge storage memory devices connected by polysilicon vias formed according to the present invention will be described here. These device levels can be two of many levels formed in a monolithic three dimensional memory array such as the one described in Walker et al. For brevity, not all of the details of Walker et al. will be included, but it will be understood that no teaching of Walker et al. is intended to be excluded.

For the sake of thoroughness, many details, including steps, process conditions, and materials, are provided. Those skilled in the art will appreciate that many of these details can be modified, added, or omitted while the results still fall within the scope of the invention.

Figure 3A:
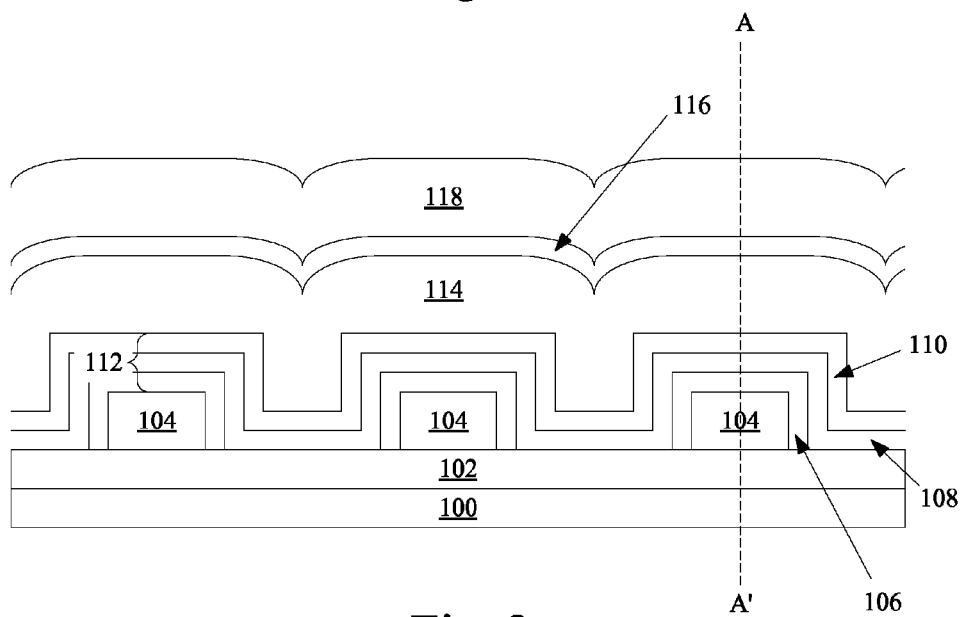
FIG. 3a is a cross-sectional view illustrating formation of a structure having a polysilicon via formed according to the present invention connecting polysilicon layers in two device levels.

Turning to FIG. 3a, fabrication begins with any suitable substrate 100, preferably a monocrystalline silicon wafer. Circuitry, for example driver and sensing circuitry (not shown), and connections to this circuitry, may be formed in the substrate 100. A dielectric insulating layer 102 is formed over the substrate.

Channel layer 104 is formed of amorphous or polycrystalline semiconductor on dielectric layer 102. Channel layer 104 is undoped or lightly doped with either p-type or n-type dopants. For clarity, this discussion will assume this layer is lightly p-doped, though one skilled in the art will understand that the conductivity types can be reversed.

Channel layer 104 is formed by any conventional method. Semiconductor layer 104 is preferably silicon, though other semiconductor materials can be used. Gu, U.S. Pat. No. 6,713,371, "Large Grain Size Polysilicon Films Formed by Nuclei-Induced Solid Phase Crystallization"; Gu et al., U.S. patent application Ser. No. 10/681,509, "Uniform Seeding to Control Grain and Defect Density of Crystallized Silicon for Use in Sub-Micron Thin Film Transistors," filed Oct. 7, 2003, issued as U.S. Pat. No. 7,195,992 on Mar. 27, 2007, and Gu et al., U.S. patent application Ser. No. 10/095,054, titled "Large-Grain P-Doped Polysilicon Films for Use in Thin Film Transistors," filed Sep. 8, 2004, published as US2006/0051911 on Mar. 9, 2006, all assigned to the assignee of the present invention and hereby incorporated by reference, all describe methods to form polysilicon films with enhanced grain size and uniformity. Any of these methods may be advantageously used to form and crystallize semiconductor layer 104.

Channel layer 104 is patterned and etched using conventional photolithography techniques to form a plurality of substantially parallel stripes separated by gaps.

Next a charge storage region is formed on the channel layer stripes 104. In this example, the charge storage region is a tunneling dielectric 106 of silicon dioxide, a charge storage dielectric 108 of silicon nitride, and a blocking dielectric 110 of silicon dioxide, forming ONO stack 112, though other dielectric materials could be used instead. Tunneling dielectric 106 can be deposited or can be grown by oxidation of a portion of channel layer 104. Charge storage dielectric 108 and blocking oxide 110 are formed by any conventional method.

The wordlines, which will comprise the gate electrode for each transistor, are formed next. In this example, heavily doped p-type polysilicon layer 114 is deposited by any suitable method. Next a layer of titanium is deposited, followed by a layer of titanium nitride. An anneal follows, in which the titanium and titanium nitride layers combine with a portion of underlying polysilicon layer 114 to form titanium silicide layer 116. Finally heavily doped n-type polysilicon layer 118 is deposited on titanium silicide layer 116.

FIG. 3a shows the structure at this point. It will be seen that the wordline stack, including polysilicon layer 114, titanium silicide layer 116, and polysilicon layer 118, is formed conformally, following the contours of the channel layers 104 and the gaps between them.

Figure 3B:
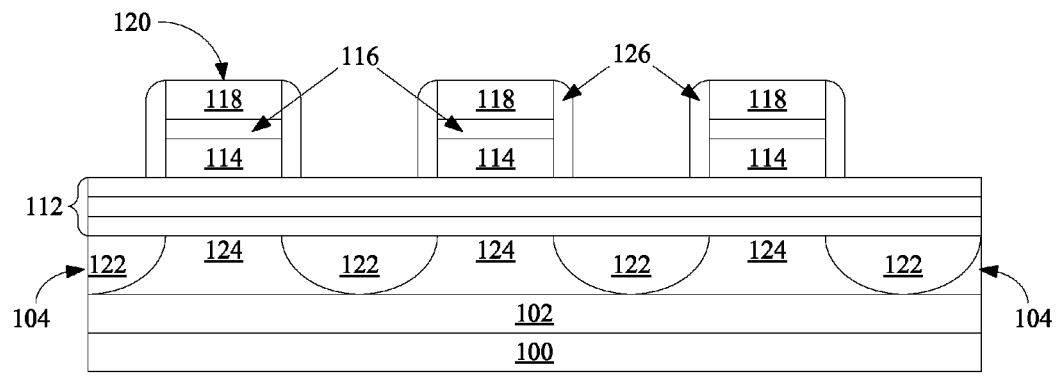

Wordline stack layers 118, 116, and 114 are then etched to form wordlines, preferably extending substantially perpendicular to channel layer stripes 104. FIG. 3b shows the same structure viewed at ninety degrees to the view shown in FIG. 3a, at a cross section along line A-A' in FIG. 3a. In FIG. 3b wordlines 120 are shown in cross section.

Walker et al. describe several possible ways of forming wordlines 120, including different layers and different dopant concentrations. What has been described here is a preferred embodiment, but the other wordline configurations described in Walker et al. could replace the one described here.

Shared source/drain regions 122 are formed in channel layer stripes 104 by doping using ion implantation, with wordlines 120 masking the channel regions 124 from implant. In some embodiments, the implant is performed in two steps: A first implant leaves the portions of channel layer stripes 104 not shielded by wordline 120 lightly doped. After formation of spacers 126, a second implant leaves the regions unshielded by the spacers 126 heavily doped. In preferred embodiments, the source/drain regions 122 are doped using an n-type dopant. The dopant concentration achievable by ion implantation is typically between about $10^{15}$ atoms/cm$^3$ and about $10^{17}$ atoms/cm$^3$. In general, dopant concentration of source/drain regions 122 is less than about $10^{17}$ atoms/cm$^3$.

Figure 3C:
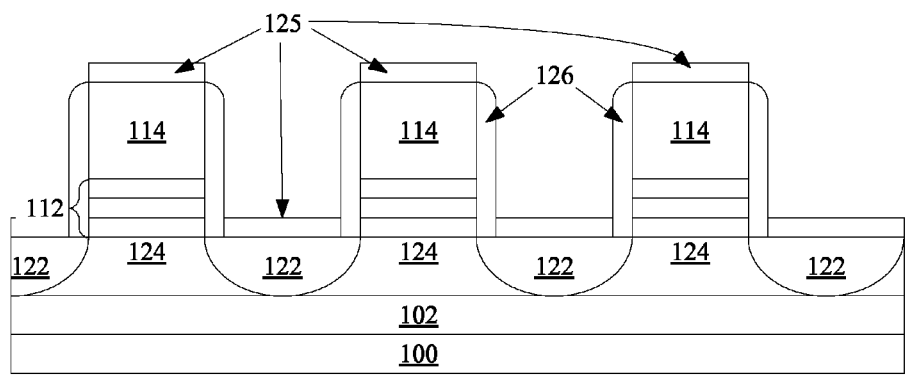

In an alternative embodiment shown in FIG. 3c, wordlines 120 could be formed of a heavily doped polysilicon layer 114 only. In this embodiment, ONO stack 112 is etched away between wordlines 120, exposing channel layer stripe 104. After formation of spacers 126 and implant of source/drain regions 122, a silicide-forming metal, for example titanium or cobalt, is deposited over the wordlines and the gaps between them. An anneal causes creation of silicide 125 wherever the silicide-forming metal overlies silicon (at the top of the wordlines 120 and on source/drain regions 122) while unreacted metal remains over the spacers and between channel layer stripes 104. A wet etch strips away the unreacted metal, leaving silicide 125 formed on the wordlines 120 and on source/drain regions 122.

Figure 3D:
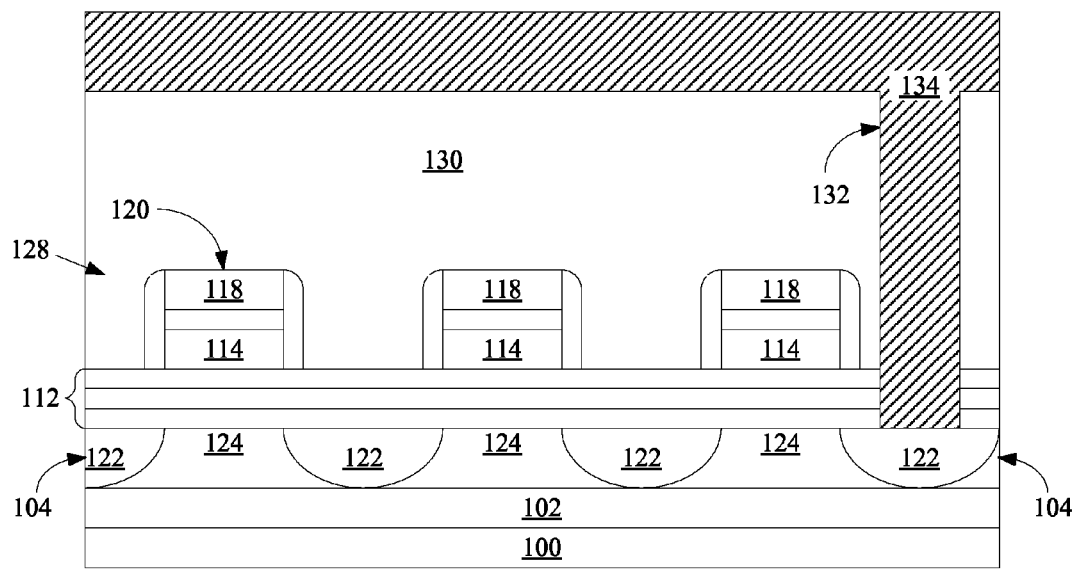
FIGS. 3d and 3e are cross-sectional views of the structure of FIGS. 3a and 3b (along the same view as that shown in FIG. 3b) showing continued fabrication of a via formed according to the present invention.

FIG. 3d illustrates the embodiment of FIG. 3b as fabrication continues. First device level 128 is now complete. An interlevel dielectric 130 is deposited over first device level 128, insulating it from the level to be formed above it. Interlevel dielectric 130 is then planarized, for example by CMP or etchback.

Next a via must be formed to provide an electrical connection between first device level 128 and the next device level (not yet fabricated.) The first step is to etch a void 132 through interlevel dielectric 130 to the layer to which electric connectivity is desired. In this example, an electrical connection will be made to one of channel layer stripes 104. Void 132 must etch through not only interlevel dielectric 130, but also through the layers of ONO stack 112, exposing the top of channel layer stripe 104.

The portion of channel layer stripe 104 that is exposed by void 132, and to which contact will be made, is preferably heavily doped. It may be a source region, a drain region, a shared source/drain region, or a heavily doped region specifically formed to serve as a contact. Void 132 is filled with very heavily doped polysilicon 134. FIG. 3d illustrates the structure at this point, including overfill of polysilicon 134. Polysilicon deposited by chemical vapor deposition is highly conformal and thus can fill even a very high-aspect ratio void. The polysilicon 134 is preferably in situ doped, preferably having a dopant concentration between about $10^{19}$ and about $10^{21}$ atoms/cm$^3$, more preferably between about 10$^{20}$ atoms/cm$^3$ and about 10$^{21}$ atoms/cm$^3$. In general, dopant concentration is more than about 10$^{19}$ atoms/cm$^3$. In situ doping allows higher dopant concentrations than can be achieved by ion implantation. Polysilicon 134 can be doped using either an n-type or a p-type dopant, but the dopant type should be the same dopant type as the polysilicon regions to which contact is to be made to avoid unintentional formation of a diode. In this example, source/drain regions 122 were n-doped, so polysilicon 134 should also be n-doped.

Figure 3E:
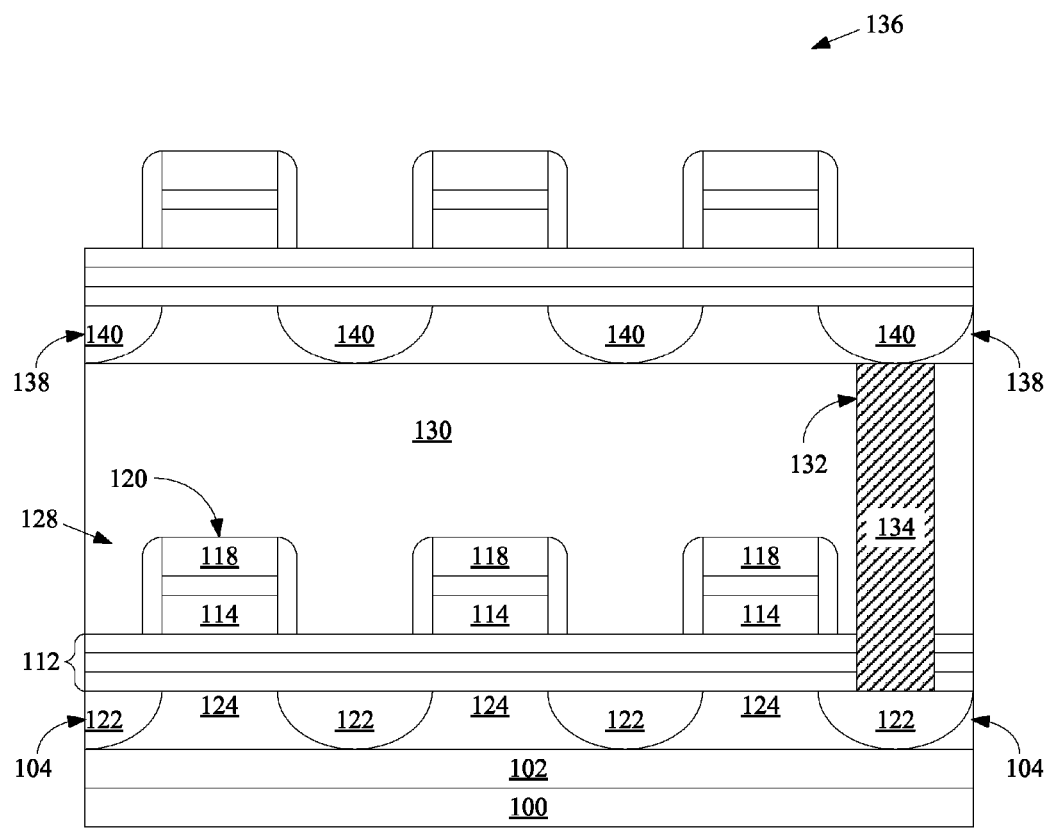

Turning to FIG. 3*e*, a planarization step is performed to remove the overfill of polysilicon 134 and expose the top of interlevel dielectric 130. This planarization can be done by CMP or etchback. A method to perform a planarizing etch of a conductive and a dielectric material creating a minimal step or no step is described in Raghuram et al., U.S. patent application Ser. No. 10/883,417, "Nonselective Unpatterned Etchback to Expose Buried Patterned Features," filed Jun. 30, 2004 (issued as U.S. Pat. No. 7,307,013 on Dec. 11, 2007) and hereby incorporated by reference. The planarizing etch of Raghuram et al. can be used.

Next a second device level 136 is formed, preferably using the same techniques and materials used to form first device level 128. Second device level 136 includes channel layer stripes 138, having source/drain regions 140. In the example shown, polysilicon via 134 provides an electrical connection between a heavily doped region of channel layer stripe 138 of second device level 136 and a heavily doped region of channel layer stripe 104 of first device level 128. As noted earlier, the heavily doped region in channel layer stripe 138 where contact is made by via 134 (in this example to a source/drain region 140) should be doped using the same dopant type used to dope polysilicon via 134 and source/drain region 122 in channel layer stripe 104 to avoid inadvertent formation of a diode.

Throughout this discussion, via 134 has been described as having been formed of polysilicon. If preferred, some other semiconductor material or semiconductor alloy, such as germanium or silicon-germanium, could be used instead.

Polysilicon via 134 is more heavily doped than the contact regions in channel layer stripes 104 and 138 to which it connects. Further, because polysilicon via 134 was in situ doped, dopant atoms are distributed evenly throughout polysilicon via 134. This is in contrast to source/drain regions 122 and 140, which were doped by ion implantation. As noted, in general, doping by ion implantation cannot achieve dopant concentrations as high as those achieved by in situ doping.

In general, the dopant concentration of the via 134 is preferably at least two orders of magnitude higher than the dopant concentration of the polysilicon layers above (channel layer stripe 138) and below (channel layer stripe 104) to which connection is made.

When polysilicon via 134 is exposed to high temperatures, either by an anneal or by subsequent thermal processing, dopants diffuse from polysilicon via 134 to the contacted regions in the channel layer stripes 104 and 138, improving the electrical contact between them.

To generalize, then the present invention provides for a structure in a semiconductor device comprising a first channel layer, wherein the first channel layer is a portion of a first device level of thin film transistors, the first device level at a first height above a substrate; a second channel layer, wherein the second channel layer is a portion of a second device level of thin film transistors, the second device level at a second height above the substrate, wherein the second height is above the first height; and a polysilicon via in contact with the first channel layer and in contact with the second channel layer.

As described, the structure of the present invention is formed by a method, the method comprising 1) forming a polysilicon via through a dielectric material 2) planarizing a shared top surface of the polysilicon via and the dielectric material and 3) forming an upper polysilicon layer on and in contact with the polysilicon via.

Figure 3F:
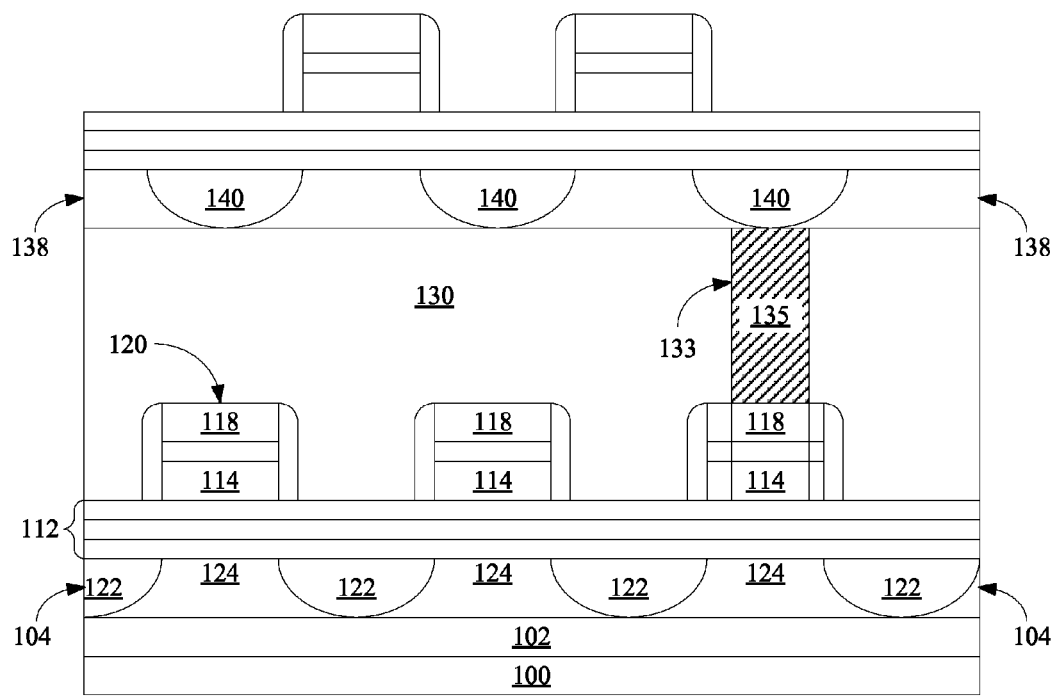
FIG. 3f is a cross sectional view of a via formed according to the present invention connecting a gate electrode in a lower device level to a channel layer in an upper device level.

It may instead be desired to form an electrical connection between wordline 120 of the first device level 128 and channel layer stripe 138 of second device level 136. Such a connection is formed in a similar way. As shown in FIG. 3*f*, a first device level 128 is formed as described, interlevel dielectric 130 is deposited, and a void 133 is etched through interlevel dielectric 130, exposing the top of wordline 120. In this example, the top of wordline 120 is doped polysilicon layer 118. (An alternative embodiment was described, shown in FIG. 3*c*, in which the top of wordline 120 was a silicide 125. In other embodiments it can be some other conductive material, such as a metal.) Void 133 is filled with very heavily doped polysilicon 135. As when via 134 was formed, via 135 should be heavily doped in situ polysilicon having the same dopant type as the polysilicon layer or layers to which it connects. Its dopant concentration is preferably between about 10$^{19}$ and about 10$^{21}$ atoms/cm$^3$, more preferably between about 10$^{20}$ atoms/cm$^3$ and about 10$^{21}$ atoms/cm$^3$.

To summarize, FIG. 3*f* shows a gate electrode at a first height above a substrate in an array of thin film transistors; a channel layer at a second height above the substrate in the array of thin film transistors, wherein the second height is above the first height; and a polysilicon via in contact with the gate electrode and in contact with the channel layer.

As shown, a polysilicon via formed according to the present invention may be connecting two polysilicon layers, one above and one below the via; or it may be connecting a polysilicon layer above to a conductive layer formed of some other material below. A polysilicon via formed according to the present invention could be used, for example, to connect a polysilicon structure such as a channel layer above the via to a monocrystalline semiconductor substrate, such as a portion of a monocrystalline silicon wafer, below the via. Alternatively, such a via could connect a polysilicon structure such as a channel layer above the via to a metal layer, such as a metal wiring layer, below the via.

To summarize, the present invention is used to create a structure in a semiconductor device comprising a lower polysilicon layer; a polysilicon via above the lower polysilicon layer, the polysilicon via having a top end and a bottom end, wherein the bottom end of the polysilicon via is in contact with the lower polysilicon layer; and an upper polysilicon layer above the polysilicon via, wherein the top end of the polysilicon via is in contact with the upper polysilicon layer. In some aspects of the invention, the structure comprises an upper channel layer in a first device level of thin film transistors, the first device level at a first height above a substrate; and a polysilicon via in contact with the upper channel layer, wherein the upper channel layer is above the polysilicon via.

Figure 4:
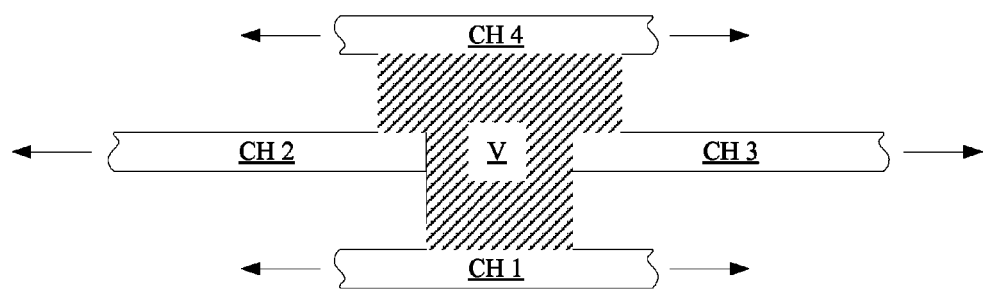
FIGS. 4 and 5 are cross-sectional views illustrating other forms that vias according to the present invention may take.
Figure 5:
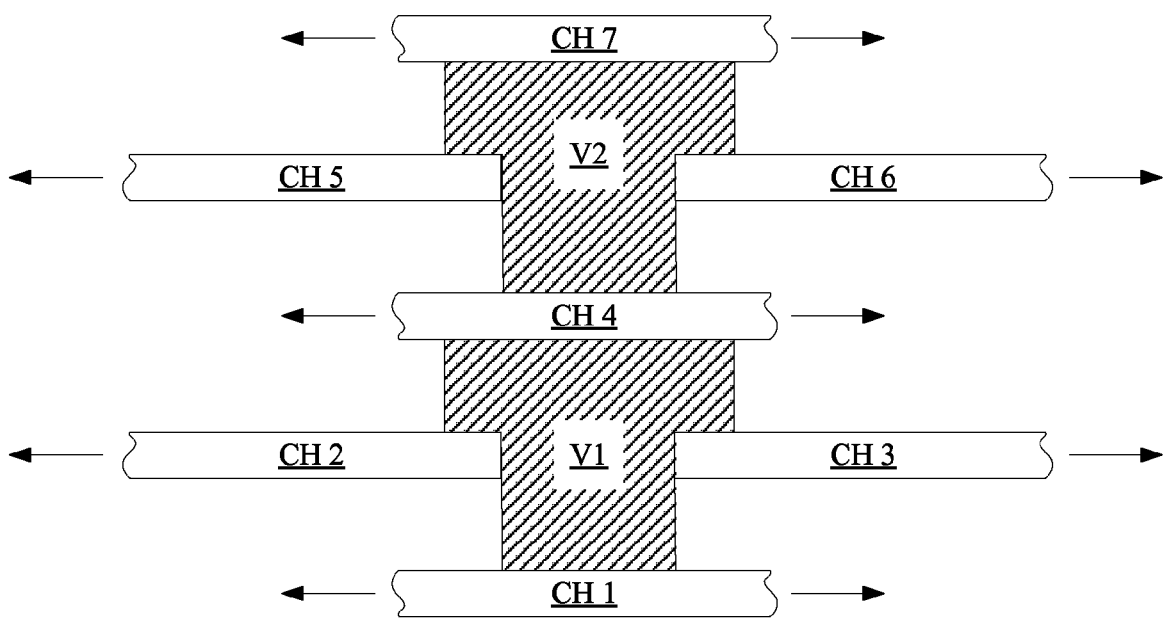

The examples provided herein show a simple layer-to-layer connection of adjacent device levels using a via having a simple, columnar shape. Many other options are possible. Walker et al., for example, teaches other types of vias. The via V shown in FIG. 4, for example, connects four channel layer stripes on three different device levels. Only a portion of channel layer stripes CH 1, CH 2, CH 3, and CH 4 are shown; they all extend left-to-right across the page, as indicated by the arrows. The via V has a stair-step profile. Still more memory levels can be connected, as shown in FIG. 5, which shows via V1 connecting three device levels, while V2, formed directly above it, connects another three device levels.

Many other via arrangements can be imagined, including any of those taught in Walker et al.

Monolithic three dimensional memory arrays are described in Johnson et al., U.S. Pat. No. 6,034,882, "Vertically stacked field programmable nonvolatile memory and method of fabrication"; Johnson, U.S. Pat. No. 6,525,953, "Vertically stacked field programmable nonvolatile memory and method of fabrication"; Knall et al., U.S. Pat. No. 6,420, 215, "Three Dimensional Memory Array and Method of Fabrication"; Lee et al., U.S. patent application Ser. No. 09/927, 648, "Dense Arrays and Charge Storage Devices, and Methods for Making Same," filed Aug. 13, 2001 (issued as U.S. Pat. No. 6,881,994 on Apr. 19, 2005); Herner, U.S. application Ser. No. 10/095,962, "Silicide-Silicon Oxide-Semiconductor Antifuse Device and Method of Making," filed Mar. 13, 2002 (issued as U.S. Pat. No. 6,853,049 on Feb. 8, 2005); Vyvoda et al., U.S. patent application Ser. No. 10/185,507, "Electrically Isolated Pillars in Active Devices," filed Jun. 27, 2002 (issued as U.S. Pat. No. 6,952,043 on Oct. 4, 2005); Scheuerlein et al., U.S. application Ser. No. 10/335, 078, "Programmable Memory Array Structure Incorporating Series-Connected Transistor Strings and Methods for Fabrication and Operation of Same," filed Dec. 31, 2002 (issued as U.S. Pat. No. 7,505,321 on Mar. 17, 2009); Vyvoda, U.S. patent application Ser. No. 10/440,882, "Rail Schottky Device and Method of Making", filed May 19, 2003 (issued as U.S. Pat. No. 7,511,352 on Mar. 31, 2009); and Cleeves et al., "Optimization of Critical Dimensions and Pitch of Patterned Features in and Above a Substrate," U.S. patent application Ser. No. 10/728,451, filed Dec. 5, 2003 (issued as U.S. Pat. No. 7,474,000 on Jan. 6, 2009), all assigned to the assignee of the present invention and hereby incorporated by reference.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

The present invention has been described herein in the context of a monolithic three dimensional memory array formed above a substrate. Such an array comprises at least a first device level formed at a first height above the substrate and a second device level formed at a second height different from the first height. Three, four, eight, or more device levels can be formed above the substrate in such a multilevel array, vertically stacked one above another in a monolithic three dimensional memory array.

As appropriate, the methods and devices of the present invention can be used in any of the monolithic three dimensional memory arrays described in any of the incorporated references.

Many other variations can be imagined. In the embodiments described, the transistors were SONOS-type memory cells. The memory cells could be of some other type of charge storage cells, such as floating gate memory cells. The transistors could lack charge-storage regions and be logic transistors rather than memory cells. The transistors in the example given were series-connected; clearly many other circuit arrangements are possible.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for forming a via structure to connect device levels in a monolithic three dimensional array, the method comprising:
   providing a substrate;
   forming a first device level of thin film transistors at a first height above the substrate, the first device level comprising a first polysilicon layer, the first polysilicon layer is a gate electrode of a thin film transistor of the first device level of thin film transistors;
   forming a polysilicon via above the first polysilicon layer, a bottom surface of the polysilicon via is in contact with the first polysilicon layer; and
   forming a second device level of thin film transistors at a second height above the substrate, wherein the second height is above the first height, the second device level comprising a second polysilicon layer,
   wherein the second polysilicon layer is above the polysilicon via, and a top surface of the polysilicon via is in contact with the second polysilicon layer.

2. The method of claim 1, wherein the monolithic three dimensional array is an array of memory cells.

3. The method of claim 2, wherein the memory cells comprise charge storage memory cells.

4. The method of claim 3, wherein the charge storage memory cells comprise SONOS-type memory cells.

5. The method of claim 3, wherein the charge storage memory cells comprise floating gate memory cells.

6. The method of claim 1, wherein the step of forming a polysilicon via comprises:
   forming a layer of dielectric material;
   etching a void in the layer of dielectric material;
   filling the void with in situ doped polysilicon; and
   planarizing the dielectric material and the in situ doped polysilicon to form a shared top surface.

7. The method of claim 1, wherein the substrate comprises monocrystalline silicon.

* * * * *